United States Patent
Suh et al.

(10) Patent No.: US 7,872,908 B2
(45) Date of Patent: Jan. 18, 2011

(54) PHASE CHANGE MEMORY DEVICES AND FABRICATION METHODS THEREOF

(75) Inventors: Dong-Seok Suh, Seoul (KR); Yoon-Ho Khang, Yongin-si (KR); Jin-Seo Noh, Seoul (KR); Vassili Leniachine, Suwon-si (KR); Mi-Jeong Song, Suwon-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/461,187

(22) Filed: Aug. 4, 2009

(65) Prior Publication Data
US 2009/0289241 A1 Nov. 26, 2009

Related U.S. Application Data

(62) Division of application No. 11/356,245, filed on Feb. 17, 2006, now Pat. No. 7,599,216.

(30) Foreign Application Priority Data

Feb. 18, 2005 (KR) ....................... 10-2005-0013531

(51) Int. Cl.
*G11C 11/00* (2006.01)
(52) U.S. Cl. ........................ 365/163; 365/148; 977/754
(58) Field of Classification Search .................. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | | |
|---|---|---|---|---|
| 5,296,716 A | * | 3/1994 | Ovshinsky et al. | 257/3 |
| 5,341,328 A | * | 8/1994 | Ovshinsky et al. | 365/163 |
| RE37,259 E | * | 7/2001 | Ovshinsky | 365/163 |
| 6,586,761 B2 | | 7/2003 | Lowrey | |
| 6,795,338 B2 | * | 9/2004 | Parkinson et al. | 365/163 |
| 6,908,812 B2 | | 6/2005 | Lowrey | |
| 7,161,167 B2 | * | 1/2007 | Johnson | 257/5 |
| 2003/0201469 A1 | | 10/2003 | Lowrey | |
| 2004/0113137 A1 | * | 6/2004 | Lowrey | 257/5 |
| 2004/0183107 A1 | | 9/2004 | Horii et al. | |
| 2005/0029503 A1 | * | 2/2005 | Johnson | 257/4 |

FOREIGN PATENT DOCUMENTS

CN 1554125 12/2004

OTHER PUBLICATIONS

Korean Office Action, dated Sep. 22, 2006, in connection with counterpart Korean Patent Application No. 10-2005-0013531.
Office Action dated Aug. 22, 2008 for counterpart Chinese Application No. 2006100049634.

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

In a memory device, a transistor may be formed on a substrate, and a first electrode may be electrically connected thereto. A phase change material film may be vertically formed on the first electrode, and a second electrode may be formed on the phase change material film.

12 Claims, 6 Drawing Sheets

US 7,872,908 B2

PHASE CHANGE MEMORY DEVICES AND FABRICATION METHODS THEREOF

PRIORITY STATEMENT

This application claims priority under 35 U.S.C. §121 as a divisional of U.S. application Ser. No. 11/356,245, filed Feb. 17, 2006 now U.S. Pat. No. 7,599,216 with the United States Patent and Trademark Office, which claims priority under 35 U.S.C. §119 to Korean Patent Application No. 10-2005-0013531, filed on Feb. 18, 2005, in the Korean Intellectual Property Office (KIPO), the entire contents each of which are incorporated herein by reference.

BACKGROUND

1. Field of the Invention

Example embodiments of the present invention relate to phase change memory devices and fabrication methods thereof, for example, phase change memory devices with lower power consumption and fabrication methods thereof.

2. Description of the Related Art

Semiconductor memory devices may be volatile or non-volatile memory devices according to whether data is retained when powered off. Volatile memory devices include, for example, dynamic random access memories (DRAM), static random access memories (SDRAM), etc. Nonvolatile memory devices include, for example, flash memory devices. Related art memory devices represent logic or binary values "0" or "1" according to whether or not an electric charge is stored therein. In one example, a DRAM may require a higher charge storage capacity because it may need to be refreshed periodically. However, as charge storage capacity increases, so does surface area of a capacitor electrode of the DRAM. This may suppress integration of the DRAM.

In another example, a flash memory cell has a gate pattern including a gate insulating film, a floating gate, a dielectric film and a control gate, which may be sequentially deposited on a semiconductor substrate. Data may be written in or erased from the flash memory cell by tunneling of electric charges through the gate insulating film. To do so, an operating voltage higher than a source voltage may be required, and the flash memory device may need to have an amplifier circuit for generating voltages necessary for the data writing/erasing operations.

An example memory, which may have nonvolatile/random access characteristics, an increased integration degree and/or a simple structure is a phase change memory device using phase change material. The phase change material may become an amorphous state or a crystalline state according to strength of a current (e.g., joule's heat) provided thereto, and the amorphous phase change material may have an electrical conductivity different from that of the crystalline phase change material.

FIG. 1 is an example graph illustrating an operating method of a phase change memory device. The graph of FIG. 1 may describe a method for writing/erasing data to/from a phase change memory cell. In the graph, a horizontal axis represents time and a vertical axis represents a temperature applied to a phase change material film.

Referring to FIG. 1, the phase change material film is phase-changed into an amorphous state when heated during a time period T1 at temperatures higher than its melting temperature Tm and cooled rapidly (curve I). The phase change material film is phase-changed into a crystalline state when heated during a time period T2 at temperatures between a crystallization temperature Tc and the melting temperature Tm, and cooled slowly (curve II). The time period T2 may be longer than the time period T1.

The amorphous phase change material film may have a higher resistance than the crystalline phase change material film. Accordingly, whether data stored in the phase change memory cell is logic "1" or logic "0" may be determined by detecting a current flowing through the phase change material film. The phase change material film may be comprised of a chalcogenide or any other suitable substance having similar or substantially similar properties. For example, the phase change material film may be comprised of a compound containing germanium (Ge), antimony (Sb), tellurium (Te) or any other suitable element, substance or compound having similar, or substantially similar, properties.

FIG. 2 is a schematic sectional view illustrating a structure of a related art phase change memory device.

Referring to FIG. 2, the related art phase change memory device may include a lower electrode 10, an upper electrode 18, a thin phase change material film 16 interposed between the electrodes 10 and 18, and a conductive contact 14 electrically connecting the lower electrode 18 with the phase change material film 16. Sides of the lower electrode 10 and the conductive contact 14 may be formed within (e.g., buried) in an insulation layer 12 and the lower electrode 10 may be electrically connected to a drain (D) region of a transistor 5. The upper electrode 18 may be electrically connected to a bit line (BL). A gate electrode (G) of the transistor 5 may be electrically connected to a word line (WL).

In the example related art phase change memory device of FIG. 2, when a current flows between the lower electrode 10 and the upper electrode 18, a current having flowed through the conductive contact 14 may flow through a contact surface 20 into the phase change material film 16. As a result, a crystalline state of phase change material around the contact surface 20 may change. The strength of the current necessary for changing the state of the phase change material may be proportional to the area of the contact surface 20. For example, the necessary current strength may be decreased as the contact surface area is reduced. However, reduction of the widths and/or areas of contact surfaces of conductive contacts may be limited due to the photolithographic process used to form the conductive contacts. This may result in lesser integration of semiconductor devices.

SUMMARY OF THE INVENTION

Example embodiments of the present invention provide phase change memory devices with reduced driving current pulse requirements and fabrication methods thereof.

In a memory device according to an example embodiment of the present invention, at least one transistor formed on a substrate. At least one first electrode may be electrically connected to the at least one transistor on the substrate. A first phase change material portion may be formed vertically on at least one of the at least one first electrode, and a second electrode formed on the phase change material film.

In one or more example embodiments of the present invention, a contact region between the first phase change material portion and the second electrode may be formed to have a width of less than or equal to 30 nm. The width of the contact region may correspond to a deposition thickness of a phase change material film. The first phase change material portion may have a first surface wider than a second surface. The first surface is a lower surface and the second surface is an upper surface. The first phase change material portion may be L-shaped. In one or more example embodiments of the present invention, at least one second phase change material portion may be formed on the substrate.

In a method for fabricating a memory device, according to one or more example embodiments of the present invention, at least one first electrode may be formed on a semiconductor substrate. A first phase change material portion may be formed vertically on at least one of the at least one first electrode, and the second electrode may be formed to contact the first phase change material portion. The first phase change material portion may be formed to have an upper width of less than or equal to about 30 nm.

In one or more example embodiments of the present invention, the first phase change material portion may be formed such that a lower surface of the vertical phase change material film is wider than an upper surface.

In one or more example embodiments of the present invention, a first insulation layer may be formed on a portion of the at least one first electrode and on the substrate. A phase change material film with a first thickness may be deposited on at least a portion of the first electrode and the first insulation layer. Portions of the phase change material film may be removed to form the first phase change material film. A second insulation layer may be deposited on the semiconductor substrate and may cover the first insulation layer and the gap. The second insulation layer may be removed to expose an upper surface of the first phase change material portion. A second electrode may be formed to contact the first phase change material portion.

In one or more example embodiments of the present invention, the phase change material film may be deposited on entire exposed surfaces of the first electrode, the substrate and the first insulation layer.

In one or more example embodiments of the present invention, a first insulation layer may be formed on a portion of the at least one first electrode and on the substrate. A phase change material film with a first thickness may be deposited on at least a portion of the first electrode and the first insulation layer. A protective layer having a second thickness may be deposited and may cover the phase change material film. Portions of the protective layer and portions of the phase change material film may be removed in sequence to form the first phase change material portion. A second insulation layer may be deposited on the semiconductor substrate and may cover the first insulation layer and the gap. The second insulation layer may be removed to expose an upper surface of the first phase change material portion and a second electrode may be formed to contact the first phase change material portion.

In a memory device according to another example embodiment of the present invention, a plurality of transistors may be formed on the substrate. A plurality of first electrodes may be formed on the substrate, and each first electrode may be connected to one of the plurality of transistors. A first phase change material portion may be formed vertically on at least one of the plurality of first electrodes, and a second phase change material portion may be formed vertically on at least a portion of the substrate. A second electrode may be formed to contact the first phase change material portion.

In one or more example embodiments of the present invention, a plurality of first insulation layers spaced apart from each other by a gap may be formed on the semiconductor substrate. Each first insulation layer may cover a portion of one of the plurality of first electrodes. A phase change material film with a first thickness may be deposited on at least a portion of at least one first electrode and the first insulation layers. Portions of the phase change material film may be removed to form the first and second phase change material portions. A second insulation layer may be deposited and may cover the first insulation layers and the gap. An upper surface of each of the first and second phase change material portions may be exposed. A second electrode may be formed to contact the first phase change material portion.

In one or more example embodiments of the present invention, at least one first and second phase change material portion of may be formed using chemical vapor deposition or atomic layer deposition.

In another method according to an example embodiment of the present invention, a plurality of first insulation layers spaced apart from each other by a gap may be formed on the substrate. Each first insulation layer may cover a portion of one of the plurality of first electrodes. A phase change material film with a first thickness may be deposited on the first electrodes, the sides of the first insulation layers and exposed portions of the substrate. A protective layer having a second thickness may be deposited and may cover the deposited phase change material film. Portions of the protective layer and portions of the phase change material film may be removed in sequence to form the first and second phase change material portions. A second insulation layer may be deposited and may cover the first insulation layers and the gap. An upper surface of each of the first and second phase change material portions may be exposed, and a second electrode may be formed to contact the first phase change material portion.

BRIEF DESCRIPTION OF THE DRAWINGS

The present invention will become more apparent by describing in detail example embodiments as illustrated in the attached drawings in which.

DETAILED DESCRIPTION OF EXAMPLE EMBODIMENTS OF THE PRESENT INVENTION

Figure 1:
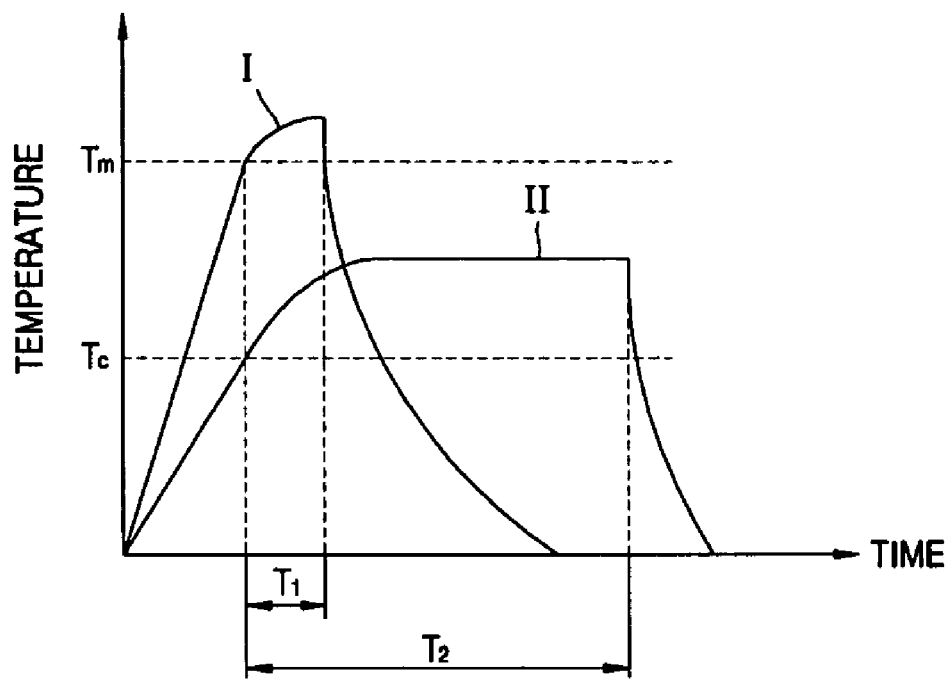
FIG. 1 is an example graph illustrating a related art operating method of a phase change memory device.
Figure 2:
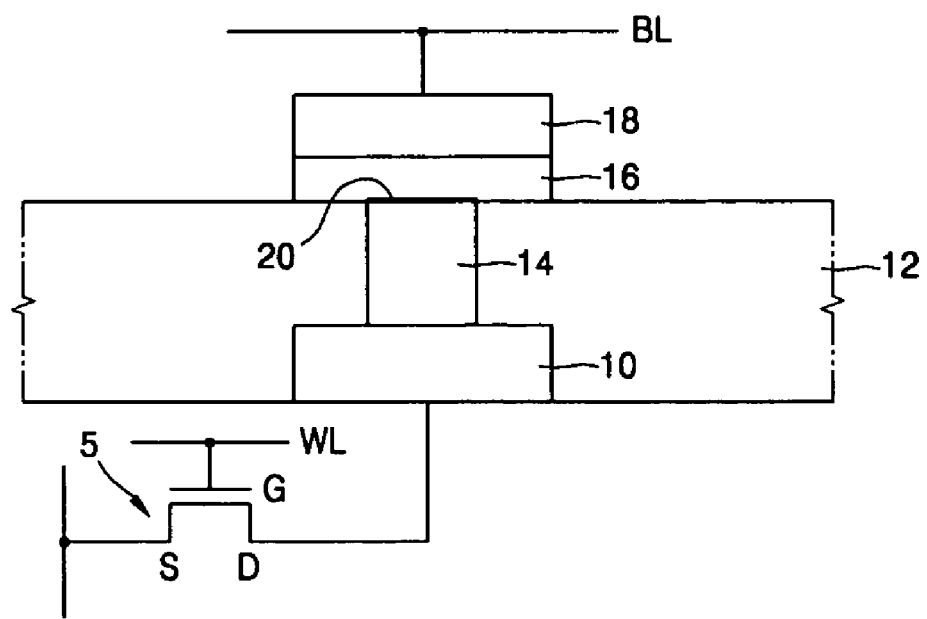
FIG. 2 is a schematic sectional view illustrating a structure of a related art phase change memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 3:
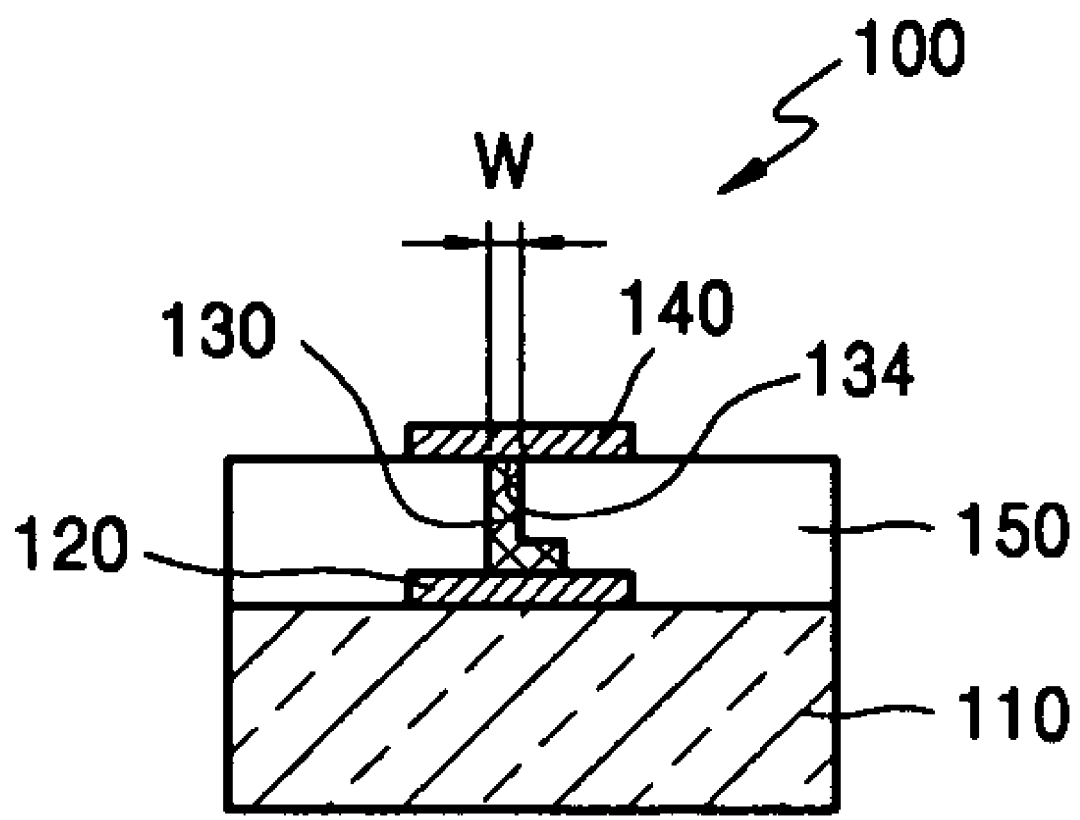
FIG. 3 is a sectional view of a phase change memory device according to an example embodiment of the present invention.

FIG. 3 is a sectional view of a phase change memory device according to an example embodiment of the present invention.

Referring to FIG. 3 a phase change memory device 100 may include a lower electrode 120 electrically connected to a transistor (not shown). The transistor may be at least partially integrated with a semiconductor substrate 110. The semiconductor substrate 110 may be a silicon substrate or the like. A phase change material film 130 may be formed, for example, vertically, on the lower electrode 120. An upper electrode 140 may be formed on the phase change material film 130 so as to be electrically connected to the phase change material film 130. An insulation layer 150 may be inserted (e.g., filled, arranged and/or placed) between the semiconductor substrate 110 and the upper electrode 140. The lower electrode 120 may be formed of TiN, TiAlN, polysilicon or any other substance or material having similar or substantially similar properties.

A contact region 134 between the phase change material film 130 and the upper electrode 140 may be formed to have dimensions of about 200 nm×20 nm. The phase change material film 140 may be comprised of, for example, a chalcogenide or any other substance or material having similar or substantially similar properties. Chalcogenide is well known to those skilled in the art.

When a current is applied to the lower electrode 120 and the upper electrode 140, a region of the phase change material film 130 contacting the upper electrode 140 may be narrower and/or have a higher current density than a region of the phase change material film 130 contacting the lower electrode 120. This may be referred to as a phase change region. In one or more example embodiments of the present invention, the surface of the phase change material film 130 contacting the upper electrode may have a width W. The width W may be less than or equal to 30 nm.

Although FIG. 3 illustrates a single memory cell, it will be understood that example embodiments of the present invention may include a plurality of memory cells.

FIGS. 4A through 4H are sectional views illustrating a method for fabricating a phase change memory device according to an example embodiment of the present invention. For the sake of brevity, a method for fabricating two memory cells, according to an example embodiment of the present invention, is illustrated in the drawings. However, it will be understood that any number of memory cells may be fabricated using example embodiments of the present invention.

Figure 4A:
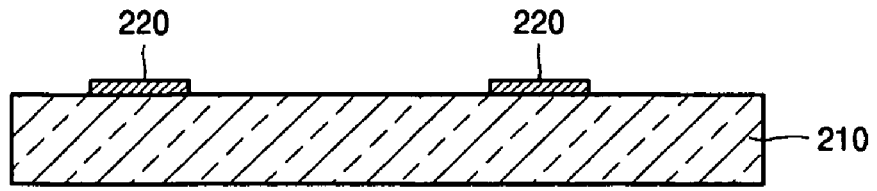
FIGS. 4A through 4H are sectional views illustrating a method for fabricating a phase change memory device according to an example embodiment of the present invention.

Referring first to FIG. 4A, a transistor (not shown) may be formed on a semiconductor substrate 210 (e.g., a silicon substrate) using any related art method. An electrode layer 220 may be formed on the semiconductor substrate and may be electrically connected to the transistor. A lower electrode 220 may be formed by patterning the electrode layer 220.

Figure 4B:
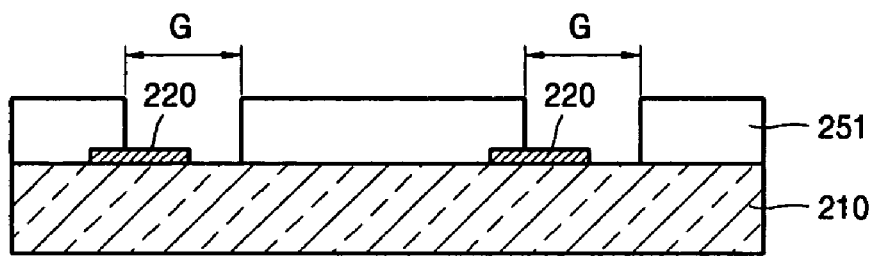

Referring to FIG. 4B, a first insulation layer 251 may be formed on the substrate 210 so as to cover at least a portion of the lower electrode 220. For example, the first insulation layer 251 may be deposited on the substrate 210 and the lower electrode 220. A portion of the lower electrode 220 and/or a portion of the substrate 210 may be exposed by patterning the first insulation layer 251 in a gap G.

Figure 4C:
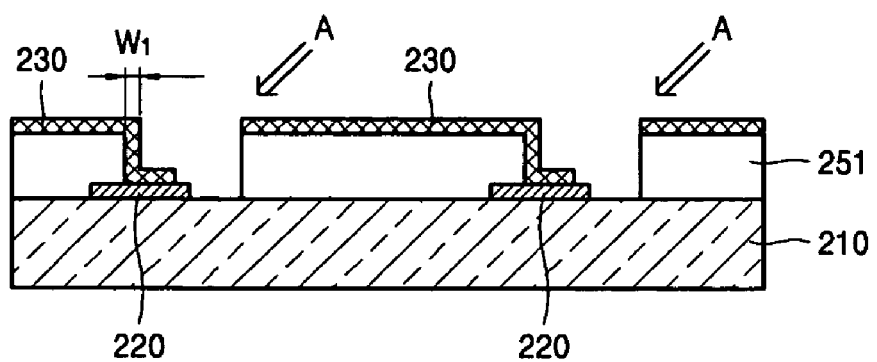

Referring to FIG. 4C, a phase change material film 230 may be formed to cover at least a portion of the lower electrode 220 and to cover the first insulation layer 251. For example, the phase change material film 230 may be deposited so as to cover at least a portion of the lower electrode 220 and the remaining, patterned first insulation layer 251. In the example shown in FIG. 4C, the phase change material film 230 may cover a portion of the lower electrode and the entire surface of the patterned first insulation layer 251. In example embodiments of the present invention, a chalcogenide or any other substance having similar or substantially similar properties may be sputtered (e.g., using a sputtering or any other suitable process) in the direction of arrow A shown in FIG. 4C. The phase change material film 230 may be formed to have a first width or thickness W1. The first width W1 may be, for example, less than or equal to about 30 nm.

Figure 4D:
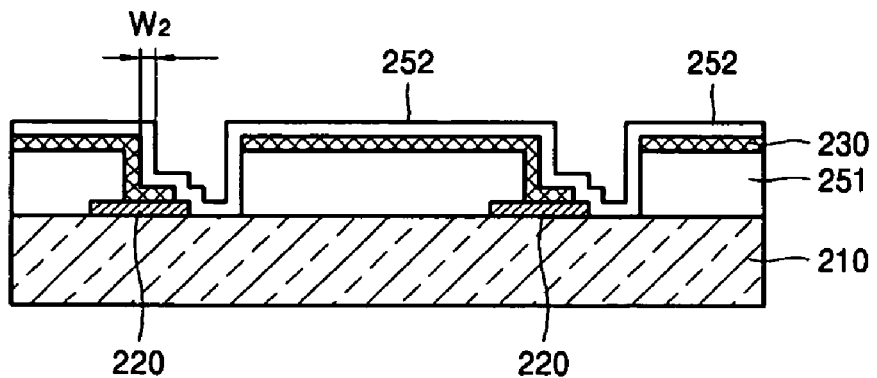

Referring to FIG. 4D, a protective layer 252 may be formed so as to cover the phase change material film 230 and the substrate 210. For example, the protective layer 252 may be deposited so as to cover the entire surface of the phase change material film 230, the exposed portions of the lower electrode 220 and the exposed portions of the substrate 210. The protective layer 252 may have a second width W2, and may be made of, for example, SiO2 or any other substance or material having similar or substantially similar properties. The protective layer 252 may protect the phase change material film 230, for example, during a subsequent etching process.

Figure 4E:
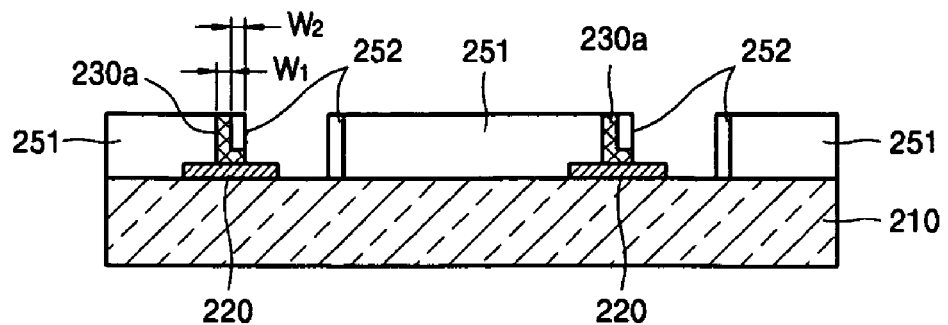

Referring to FIG. 4E, a vertical phase change material film 230A may be formed by etching (e.g., anisotropically etching) the protective layer 252 and/or the phase change material film 230. The vertical phase change material film 230A may be formed to have a lower portion (e.g., lower surface) that is wider than an upper portion (e.g., upper surface). The upper portion of the vertical phase change material film 230A may have the first width W1 and the lower surface of the vertical phase change material film 230A may have a width of approximately the sum of the first width W1 and the second width W2. For example, as shown in FIG. 4E, the vertical phase change material may have an L-shape.

Figure 4F:
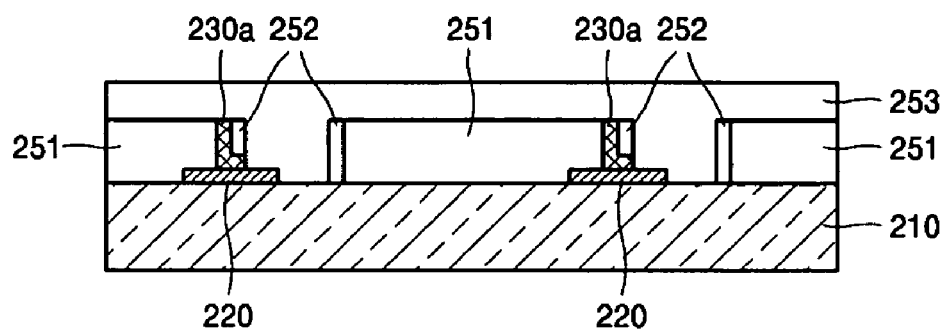

Referring to FIG. 4F, a second insulation layer 253 may be formed on the first insulation layer 251 so as to at least partially cover the gap G. For example, as shown in FIG. 4F, the second insulation layer 253 may cover or fill the entire gap G. In this example, the second insulation layer 253 may be formed of the same material as the first insulation layer 251 and/or the protective layer 252. However, in example embodiments of the present invention, different materials may be used for the first insulation layer 251, the protective layer 252 and/or the second insulation layer 253.

Figure 4G:
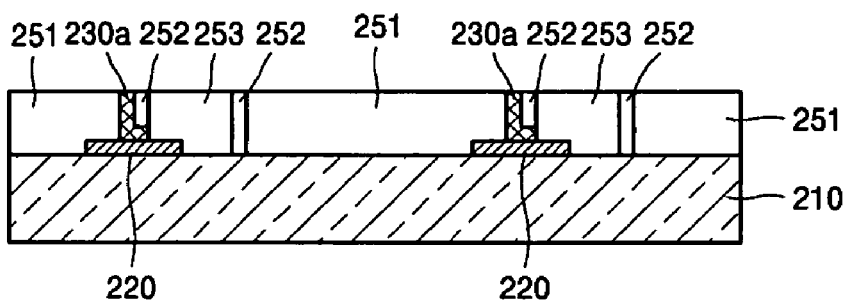

Referring to FIG. 4G, the second insulation layer 253 may be planarized using chemical mechanical polishing (CMP), or any other suitable polishing process, so that the vertical phase change material film 230A may be exposed. At least a portion of an upper portion of the phase change material film 230A may be removed.

Figure 4H:
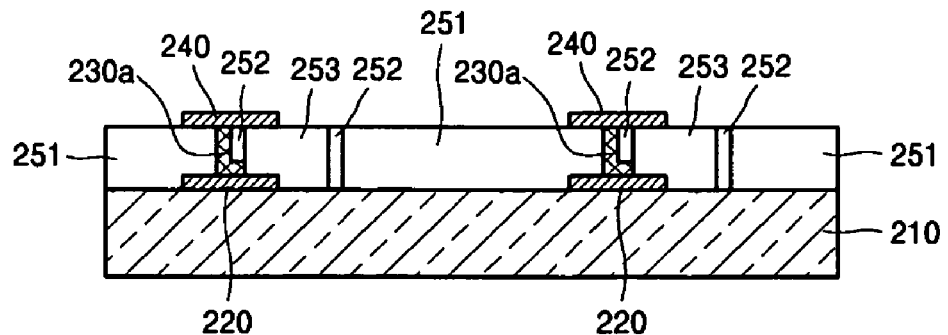

Referring to FIG. 4H, an upper electrode 240 electrically connected to the phase change material film 230 may be formed by depositing an electrode layer 240 on the phase change material film 230, the electrode layer 240 may be patterned to form the upper electrode 240, and a discrete memory device may be produced using a singulation, or any other suitable process.

FIGS. 5A through 5H are sectional views illustrating a method for fabricating a phase change memory device according to another example embodiment of the present invention. For the sake of brevity, a method for fabricating two memory cells, according to an example embodiment of the present invention, is illustrated in the drawings. However, it will be understood that any number of memory cells may be fabricated using example embodiments of the present invention.

Figure 5A:
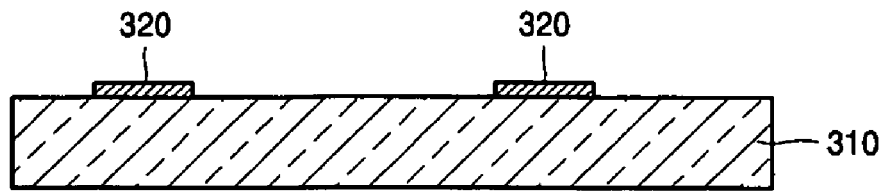
FIGS. 5A through 5H are sectional views illustrating a method for fabricating a phase change memory device according to another example embodiment of the present invention.

Referring first to FIG. 5A, a transistor (not shown) may be formed on a semiconductor substrate 310 (e.g., a silicon substrate) using any related art method. An electrode layer 320 may be formed on the semiconductor substrate and electrically connected to the transistor. A lower electrode 320 may be formed by patterning the electrode layer 320.

Figure 5B:
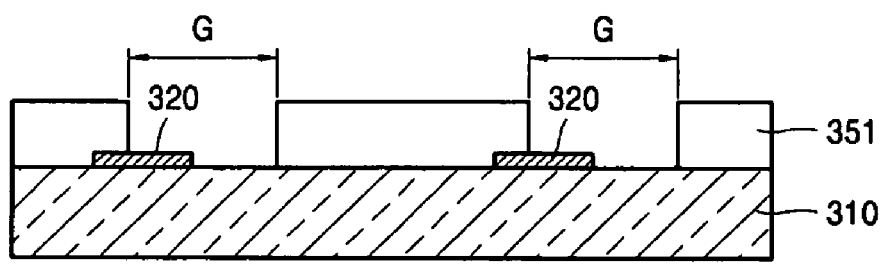

Referring to FIG. 5B, a first insulation layer 351 may be deposited on the semiconductor substrate 310 so as to cover at least a portion of the lower electrode 320. For example, the first insulation layer 351 may be deposited to cover the entire surface of the lower electrode 320. At least a portion of the lower electrode 320 and a portion of the semiconductor substrate 310 may be exposed by patterning the first insulation layer 351 in a gap G.

Figure 5C:
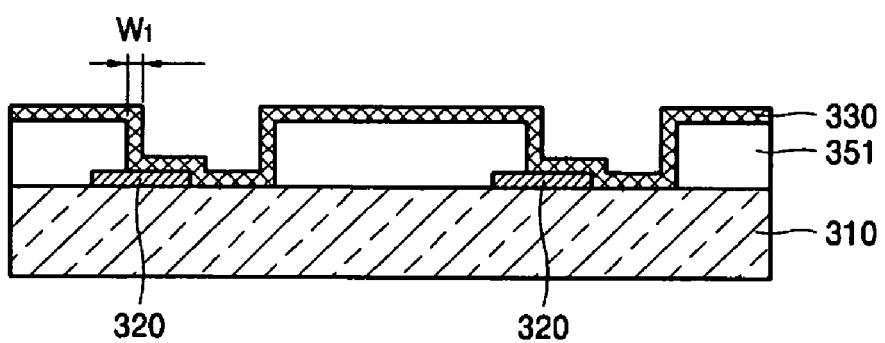

Referring to FIG. 5C, a phase change material film 330 covering the lower electrode 320 and a portion of the patterned first insulation layer 351 may be deposited to have a first width W1 through CVD, ALD or any other suitable deposition process. In example embodiments of the present invention, a chalcogenide, or any other substance or material having similar or substantially similar properties, may be deposited to form the phase change material film 330 having a width of less than or equal to about 30 nm. The first width W1 may become an upper width of a vertical phase change material film 330A that will be described later. In one or more example embodiment of the present invention, accordingly, the upper width of the vertical phase change material film 330A may be controlled by adjusting the first width W1.

Figure 5D:
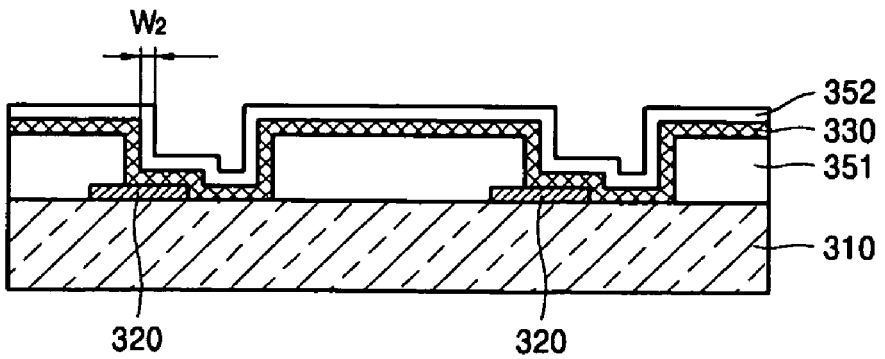

Referring to FIG. 5D, a protective layer 352 covering at least a portion of the phase change material film 330 may be deposited on the semiconductor substrate 310 so as to have a second width W2. For example, as shown in FIG. 5D, the protective layer 352 may cover the entire surface of the phase change material 330. The protective layer 352 may be made of $SiO_2$ or any other substance or material having similar or substantially similar properties. The protective layer 352 may protect the phase change material film 330 during, for example, an etching process.

Figure 5E:
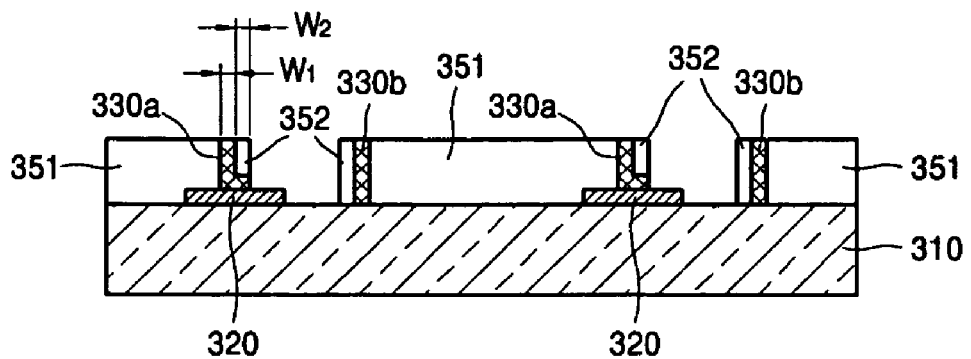

Referring to FIG. 5E, a vertical phase change material film 330A may be formed by removing a phase change material film 330 on the first insulation layer 351 and an edge of the first electrode 320. The protective layer 352 and/or the phase change material film 330 may be removed by etching (e.g., anisotropically etching).

The phase change material film 330A of a memory cell may be insulated from a phase change material film 330A of a neighboring memory cell. The vertical phase change material film 330A may be formed to have a lower portion with a surface width greater than a surface width of an upper portion. For example, an upper surface of the vertical phase change material film 330A may be a first width W1, and the lower surface of the vertical phase change material film 330A may have a width of approximately equal to the sum of the first width W1 and the second width W2. The phase change material film 330B spaced apart from the lower electrode 320 may not be removed.

Figure 5F:
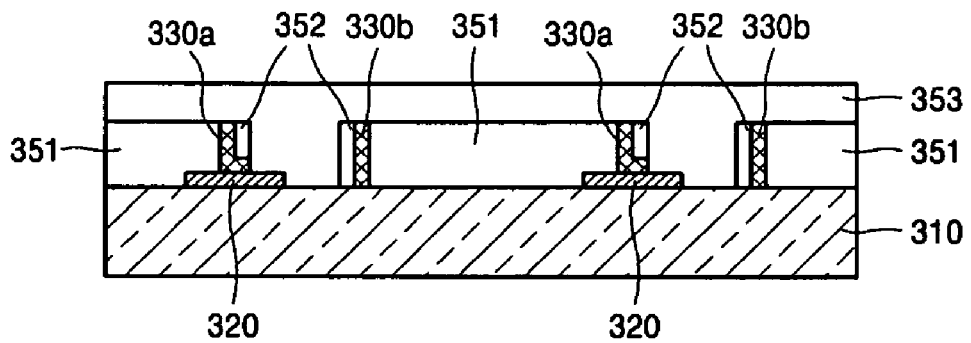

Referring to FIG. 5F, a second insulation layer 353 may be formed on the first insulation layer 351 so as to cover at least a portion of the gap G. For example, as shown in FIG. 5F, the second insulation layer 353 may cover or fill the entire gap G. In this example, the second insulation layer 353 may be formed of the same or substantially the same material as the first insulation layer 351 and/or the protective layer 352. However, in one or more example embodiment of the present invention, the first insulation layer 351, the protective layer 352 and/or the second insulation layer 353 may be comprised of different materials.

Figure 5G:
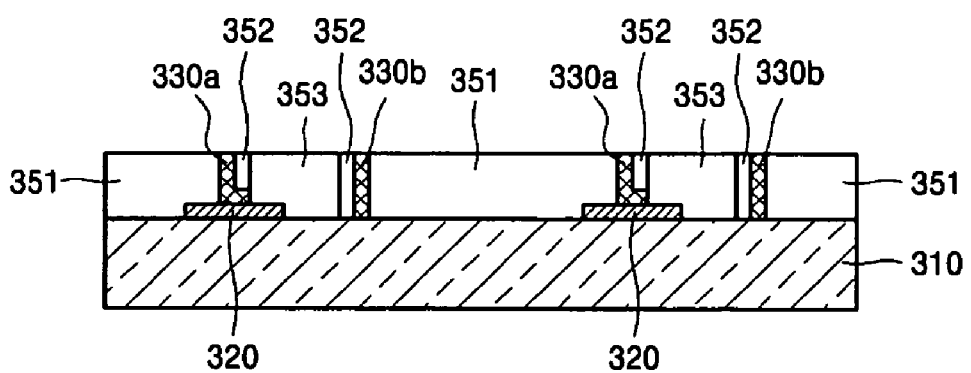

Referring to FIG. 5G, at least the second insulation layer 353 may be planarized using chemical mechanical polishing (CMP), or any other suitable polishing process, to expose at least a portion of the vertical phase change material film 330A. At least part of an upper portion of the phase change material film 330A and 330B may be removed.

Figure 5H:
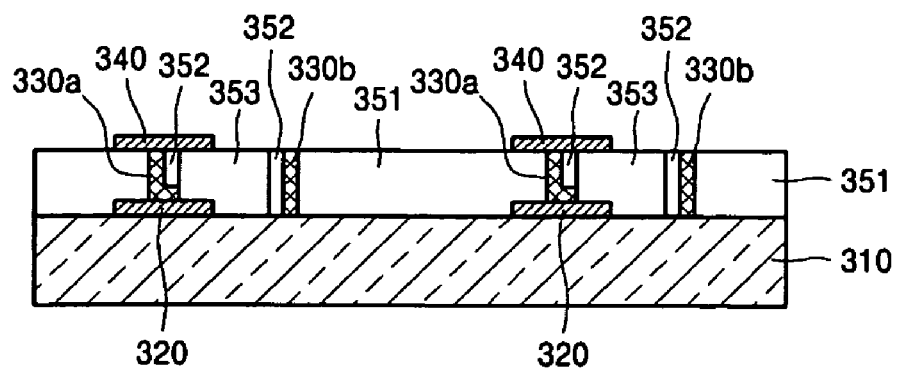

Referring to FIG. 5H, an upper electrode 340 electrically connected to the phase change material film 330 may be formed by depositing an electrode layer 340 on the phase change material film 330, the electrode layer 340 may be patterned to form the upper electrode 340, and a discrete memory device may be produced through a singulation or any other suitable process.

In example embodiments of the present invention, a vertical phase change material film having a width of less than or equal to about 30 nm may be formed between an upper electrode and a lower electrode. An upper surface of the phase change material film may have a width less than about 30 nm. In one or more example embodiments of the present invention, a contact region between the upper electrode and the phase change material film may be reduced, a current density at the contact area may be increased and/or the strength of a current applied to the memory device may be reduced.

In example embodiments, the phase change material film may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material film may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material film is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, Sb2—Te3 or Ge—Te alloys; example quaternary phase-change chalcogenide alloys may include one or more of an Ag—In—Sb—Te, (Ge—Sn)—Sb—Te, Ge—Sb—(Se—Te) or Te81—Ge15—Sb2—S2 alloy, for example.

In an example embodiment, the phase change material film may be made of a transition metal oxide having multiple resistance states, as described above. For example, the phase change material may be made of at least one material selected from the group consisting of NiO, TiO2, HfO, Nb2O5, ZnO, WO3, and CoO or GST (Ge2Sb2Te5) or PCMO(PrxCa1-xMnO3). The phase change material film may be a chemical compound including one or more elements selected from the group consisting of S, Se, Te, As, Sb, Ge, Sn, In and Ag.

Although example embodiments of the present invention have been described, for example, with regard to FIGS. 4A-4H and 5A-5H, it will be understood that at least some aspects of these example embodiments may be interchangeable.

While the present invention has been particularly shown and described with reference to the example embodiments illustrated in the drawings, it will be understood by those of ordinary skill in the art that various changes in form and details may be made therein without departing from the spirit and scope of the present invention as defined by the following claims.

What is claimed is:

1. A memory device comprising:
   at least one first electrode on a substrate;
   a first insulating layer pattern formed on the at least one first electrode;
   an L-shaped first phase change material pattern having a first thickness formed on an inner side wall of the first insulating layer pattern and on an upper surface portion of the first electrode; and
   a second electrode formed to contact the first phase change material pattern.

2. The device of claim 1, wherein a contact region between the first phase change material pattern and the second electrode is formed to have a width of less than or equal to 30 nm.

3. The device of claim 2, wherein the width of the contact region corresponds to a deposition thickness of the first phase change material pattern.

4. The device of claim 1, wherein the first phase change material pattern a first surface wider than a second surface.

5. The device of claim 4, wherein the first surface is a lower surface and the second surface is an upper surface.

6. The device of claim 1, further including,
   at least one second phase change material pattern formed on the substrate.

7. The memory device of claim 1, further including,
   a plurality of transistors formed on the substrate,
   a plurality of first electrodes formed on the substrate, each first electrode being connected to a corresponding one of the plurality of transistors, wherein
   the first phase change material pattern includes,
      a first phase change material portion formed vertically on at least one first electrode, and
      a second phase change material portion formed vertically on at least a portion of the substrate.

8. The device of claim 7, further including,
   a protective layer portion formed vertically beside the second phase change material portion on a portion of the substrate.

9. The device of claim 1, further including,
   a protective layer portion formed vertically between the L-shaped first phase change material pattern and the second electrode.

10. The device of claim 9, further including,
    a protective layer portion formed vertically on at least a portion of the substrate.

11. The device of claim 9, further including,
    a second insulating layer filling a space between the first insulating layer pattern on the substrate.

12. The device of claim 11, wherein the second insulating layer is formed of material different from the protective layer portion.

* * * * *